United States Patent [19]

Fisher et al.

[11] Patent Number: 5,029,335

[45] Date of Patent: Jul. 2, 1991

[54] HEAT DISSIPATING DEVICE FOR LASER DIODES

[75] Inventors: James H. Fisher, Aurora; John H. Clark, Wheaton, both of Ill.; Edward J. Burke, Plano; James L. Bierschenk, Rowlett, both of Tex.

[73] Assignee: Amoco Corporation, Chicago, Ill.

[21] Appl. No.: 313,228

[22] Filed: Feb. 21, 1989

[51] Int. Cl.[5] .................................... H01S 3/04

[52] U.S. Cl. .................................... 372/36; 165/80.3; 361/384; 174/52.1; 174/16.3

[58] Field of Search .................... 372/36, 34; 361/379, 361/381, 383, 384, 388–390; 174/16 HS, 50, 52 R; 165/177, 183, 185, 80.1, 80.2, 80.3

[56] References Cited

U.S. PATENT DOCUMENTS

| | | | |
|---|---|---|---|
| 3,004,196 | 10/1961 | Drexel | 357/82 |
| 4,459,638 | 7/1984 | Brehm et al. | 165/80.3 |
| 4,656,635 | 4/1987 | Baer et al. | 372/34 |

*Primary Examiner*—Georgia Epps

*Attorney, Agent, or Firm*—Gary J. Cunningham; William H. Magidson; Ralph C. Medhurst

[57] ABSTRACT

A heat dissipating device and method for dissipating waste heat produced by a solid state device, which includes (a) a solid state device and (b) a heat sink for dissipating waste heat produced by the solid state device which includes a base member being in thermal contact with the solid state device and a plurality of elongated heat conducting elements extending outwardly from the base member.

17 Claims, 2 Drawing Sheets

FIG-1-
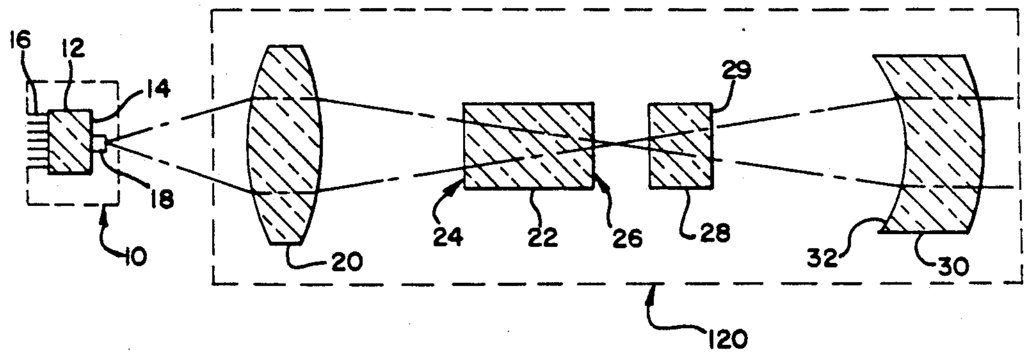
FIG-4-
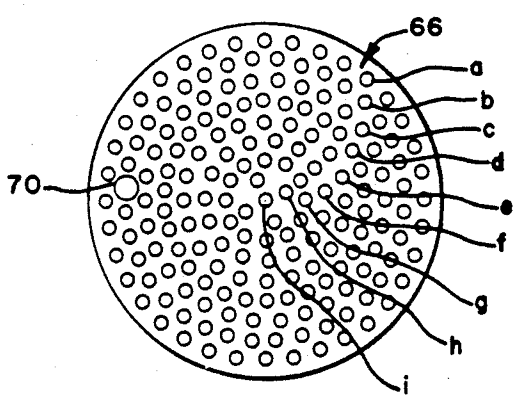

HEAT DISSIPATING DEVICE FOR LASER DIODES

FIELD OF THE INVENTION

This invention relates to an apparatus and process for dissipating waste heat produced by a solid state device, which includes (a) a solid state device, and (b) a heat sink for dissipating waste heat produced by the solid state device, which includes a base member being in thermal contact with the solid state device and a plurality of elongated heat conducting elements extending outwardly from the base member.

BACKGROUND OF THE INVENTION

A laser is a device which has the ability to produce monochromatic, coherent light through the stimulated emission of photons from atoms, molecules or ions of an active medium which have typically been excited from a ground state to a higher energy level by an input of energy. Such a device contains an optical cavity or resonator which is defined by highly reflecting surfaces which form a closed round trip path for light, and the active medium is contained within the optical cavity.

If a population inversion is created by excitation of the active medium, the spontaneous emission of a photon from an excited atom, molecule or ion undergoing transition to a lower energy state can stimulate the emission of photons of substantially identical energy from other excited atoms, molecules or ions. As a consequence, the initial photon creates a cascade of photons between the reflecting surfaces of the optical cavity which are of substantially identical energy and exactly in phase. A portion of this cascade of photons is then discharged out of the optical cavity, for example, by transmission through one or more of the reflecting surfaces of the cavity. These discharged photons constitute the laser output.

Excitation of the active medium of a laser can be accomplished by a variety of methods. However, the most common methods are optical pumping, use of an electrical discharge, and passage of an electric current through the p-n junction of a semiconductor laser. Semiconductor lasers contain a p-n junction which forms a diode, and this junction functions as the active medium of the laser. Such devices are also referred to as laser diodes. The efficiency of such lasers in converting electrical power to output radiation is relatively high, and for example, can be in excess of 40 percent.

In order to effect optical pumping, the photons delivered to the lasant material from a radiant source must be of a very precise character. In particular, the pumping radiation must be of a wavelength which is absorbed by the lasant material to produce the required population inversion.

The flow of current through a laser diode perturbs the electron population in the valence and conduction bands. The energy gap between the lowest empty level in the valence band and the lowest filled level in the conduction band is altered. The net effect is that the output wavelength is dependent on the driving current. The wavelength increases with increasing drive current. For gallium aluminum arsenide laser diodes, the rate of increase is typically 0.025 nm/mA.

The output wavelength is highly dependent on the detailed electronic distribution of the valence and conduction bands. Consequently, output wavelength is a function of the temperature of the junction. The emitted wavelength increases if the temperature of the junction is increased. Typically the emission wavelength changes by 0.3 to 0.4 nanometers per degree centigrade. Clearly, if a stable output wavelength is required, the temperature of the laser diode must be maintained at a constant level. This is usually achieved by using a small thermoelectric cooler unit, a thermocouple sensor and a feedback circuit.

The gain of any lasing medium is a function of the population inversion ratio. This is actually a ratio of the perturbed population distribution to the equilibrium (Boltzmann) distribution. As the temperature of a laser diode junction rises, the natural Boltzman population distribution of the electrons changes and even more electrons are required in the conduction band to achieve the same effective population inversion. Therefore, for a fixed driving current, increasing the temperature of the laser diode will normally decrease its output power.

Laser diode lifetimes in excess of 50,000 hours are not uncommon. However, there are certain factors which can have a drastic effect on this. Both high device temperature and sudden current spikes can be fatal to laser diodes.

Device failure can be either sudden and catastrophic, or a gradual degradation of performance. The gradual degradation process can be due to the accumulation of crystalline flaws in the active junction region. These can be small or large, but all have their origin as missing atoms or extra (interstitial) atoms in the lattice. At these so-called lattice defects, there is a discontinuity in the band structure which can allow electrons to "leak" from the conduction band down to the valence band without emission of a photon. The excess energy is instead released non-radiatively as vibrational energy of the lattice. Continual driving of a laser diode near its damage threshold, sudden spikes in the driving current, and failure to maintain a reasonable junction temperature, can all lead to an increase in the number and size of the lattice defects in the junction.

The temperature of a laser diode rises above ambient temperature during normal operation for two reasons. Firstly, the semiconductor is heated by simple resistive heating. Secondly, the internal photon flux may be reabsorbed, particularly by impurities. Clearly, to prolong the life of a laser diode it is advantageous to cool the diode in some way.

Device failure can also result from degradation of the output facet. This can be sudden or gradual. It is caused by thermal effects, sometimes in conjunction with thermal oxidation. Large spikes in the driving current can produce bursts of heat which exceed the heat dissipation capacity of the device. This may cause fatal damage or fractures to the output facet.

It is therefore very important to control the temperature of diode lasers since: (1) a diode laser generates an enormous amount of waste heat per unit volume and temperature significantly affects, alters and changes the characteristics of laser diodes by changing the wavelength of the output radiation of laser diode pumps; (2) the lifetime of a laser diode is a function of its temperature; (3) the lifetime of a laser diode can be decreased significantly in response to a significant rise in temperature; and (4) the power output of a laser diode at a constant drive current is a function of temperature, and will usually increase as the temperature is lowered.

It is therefore desirable to provide an improved heat removal process and device for removing waste heat from laser diodes, which overcomes most if not all of the aforementioned problems.

SUMMARY OF THE INVENTION

An embodiment of the instant invention includes an apparatus for dissipating waste heat, comprising: (a) a solid state device; and (b) a heat sink including a base member being in thermal contact with said solid state device and a plurality of elongated heat-conducting elements extending outwardly from said base member.

Another embodiment of the instant invention includes an apparatus for dissipating waste heat, comprising: (a) a laser diode for generating laser light; and (b) a heat sink including a base member being in thermal contact with said laser diode and a plurality of elongated heat-conducting elements extending outwardly from said base member.

An embodiment of the instant invention also includes an optically pumped laser, comprising: (a) solid-state component means for generating laser light along an optical path, said solid-state component means including solid-state optical pumping means for generating optical pumping radiation at a preselected wavelength and a lasant member comprising a solid lasant material for receiving said radiation from said optical pumping means and emitting laser light; and (b) heat removal means for removing heat from said optical pumping means wherein said heat removal means comprises a base member in thermal contact with said optical pumping means, and a plurality of elongated heat-conducting elements extending outwardly from said base.

The instant invention also includes a method of dissipating waste heat produced by a laser diode, comprising: (a) generating laser light from a laser diode while simultaneously producing waste heat; (b) conveying waste heat generated by said laser diode away therefrom with a heat sink which comprises a base member in thermal contact with said laser diode, and a plurality of elongated heat-conducting elements extending outwardly from said base; and (c) circulating air about said plurality of elongated heat-conducting elements of said heat sink whereby heat is transferred from said heat-conducting elements to said circulating air.

An object of the invention is to provide a solid-state laser and process that is highly efficient in both optical pumping and in heat removal.

A further object is to provide a portable and durable optically pumped laser that is simple in construction, easy to install and maintain, and that will not lose its cooling or operating properties with age.

BRIEF DESCRIPTION OF THE DRAWINGS

FIG. 1 of the drawings is a schematic view representative of an embodiment of this invention.

FIG. 4 of the drawings is a cross-sectional view taken along the lines 4—4 of FIG. 2.

DETAILED DESCRIPTION OF THE PREFERRED EMBODIMENTS

Figures 2, 3:
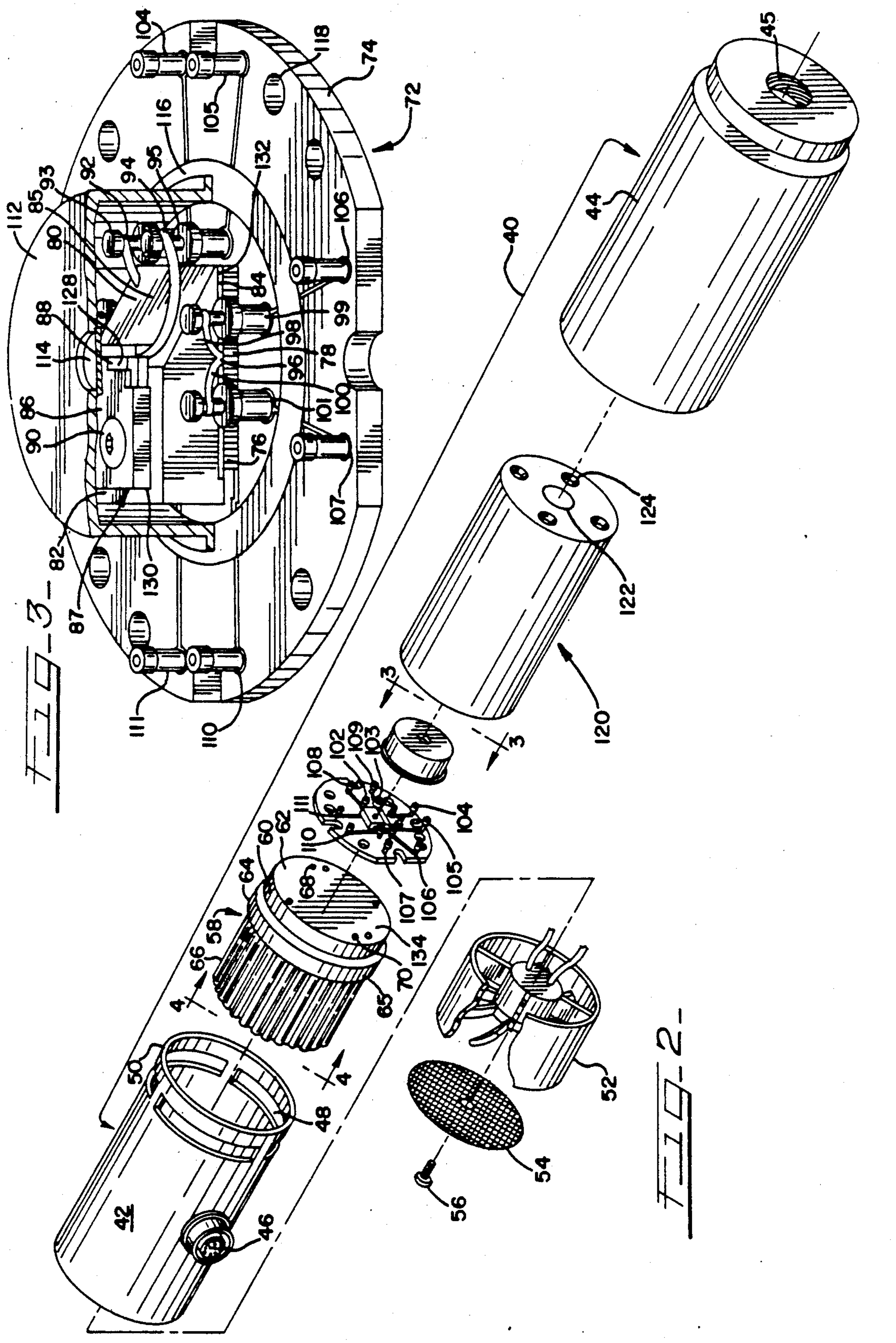
FIG. 2 of the drawings is a perspective view of the embodiment set forth in FIG. 1.
FIG. 3 of the drawings is an exploded perspective view taken along the lines 3—3 of FIG. 2.

While this invention is susceptible of embodiments in many forms, there is shown in FIGS. 1-4 one embodiment suitable for use in the practice of this invention, with the understanding that the present disclosure is not intended to limit the invention to the embodiment illustrated.

Referring to FIG. 1, a heat dissipating device 10 is shown. The heat dissipating device 10 consists of an elongated heat sink 12, having a base 14 at one end and a plurality of elongated thermally conductive members or pins 16 at the other end of base 14. The base 14 is in thermal contact with a solid-state optical pumping means for generating optical pumping radiation 18. The optical pumping means 18 can be a laser diode, laser diode array, light-emitting diode, light-emitting diode array, and equivalents thereof. A preferred solid-state optical pumping means for generating optical pumping radiation is a laser diode, hereafter referred to as 18. Light from laser diode 18 is guided by lens 20 into lasant material 22.

The laser diode 18 output radiation should substantially match the desired absorption band of lasant material 22. For Nd:YAG as the lasant material this wavelength would preferably be at about 808 nm. If lasant materials other than Nd:YAG are used, then appropriate semiconductor materials, compositions, laser diode structures, or operating conditions must be chosen so that the laser diode output meets the above wavelength criteria.

In the optically pumped laser of FIG. 1, laser diode 18 emits light at a wavelength at about 808 nm, assuming the absorption peak of the lasant material 22 is at about 808 nm. As is known to those skilled in the art, the absorption peak of the lasant material can vary from sample to sample. Accordingly, the above wavelength value is merely exemplary.

Heat sink 12 can be passive in character. Heat sink 12 can also include a thermoelectric cooler to help maintain laser diode 18 at a constant temperature and thereby ensure optimal operation thereof. During operation the laser diode 18 will be attached to a suitable power supply. Electrical leads from laser diode 18, which are connected to a power supply, are not illustrated in FIG. 1.

Lasant material 22 has a suitable reflective coating on input surface 24 and is capable of being pumped by the light from laser diode 18. The reflective coating on input surface 24 is highly transparent with respect to light produced by the laser diode 18 but is highly reflective with respect to light produced by the lasing of lasant material 22. The lasant material 22 also has an output surface 26.

Light emitted by the lasing of lasant material 22 from optical pumping means 12, is passed through a nonlinear optical material 28 to output coupler 30 which has a suitable reflective coating on surface 32 which is highly reflective with respect to light emitted by lasant material 22 but substantially transparent to frequency-modified light produced by nonlinear optical material 28. Nonlinear optical material 28 has an output surface 29. Output coupler 30 is configured in such a manner that it serves to collimate the output radiation from the laser which passes through it. It should be understood, however, that nonlinear optical material 28 is not required for the practice of this invention, and merely represents a preferred embodiment of this invention.

Lens 20 serves to focus light from laser diode 18 onto lasant material 22. This focusing results in a high pumping intensity and an associated high photon to photon conversion efficiency in lasant material 22. Any conventional optical means for focusing light can be used in place of lens 20. For example, a gradient index lens, a ball lens, an aspheric lens or a combination of lenses can be utilized. Lens 20 is not essential to the operation of this invention, and the use of such focusing means merely represents a preferred embodiment.

Any conventional lasant material 22 can be utilized in the present invention, provided that it is capable of being optically pumped by the laser diode 18 selected. Suitable lasant materials include, for example, materials consisting of neodymium-doped yttrium vanadate ($Nd:YVO_4$); neodymium and/or chromium-doped gadolinium scandium gallium garnet (Nd, Cr:GSGG); thulium, holmium and/or erbium-doped yttrium aluminum garnet (Tm, Ho, Er:YAG); titanium sapphire ($Ti:Al_2O_3$); glassy and crystalline host materials which are doped with an active material. Highly suitable active materials include, ions of chromium, titanium and the rare earth metals. A neodymium-doped YAG is a highly suitable lasant material 22 for use in combination with laser diode 18 producing light having a wavelength of about 808 nm. When pumped with light of this wavelength, the neodymium-doped YAG or lasant material 22 can emit light having a wavelength of 1,064 nm. The geometric shape of lasant material 22 can vary widely.

Lasant material 22 has a reflective coating on surface 24. This coating is conventional in character and is selected so as to transmit as much incident pumping radiation from laser diode 18 as possible, while being highly reflective with respect to the radiation or light produced by the lasing of lasant material 22.

For a neodymium-doped YAG rod lasant material 22 which is pumped with light having a wavelength of 808 nm, the coating on input surface 24 should be substantially transparent to 808 nm light and highly reflective with respect to light having a wavelength of 1,064 nm. In a preferred embodiment, this coating will also be highly reflective of light having a wavelength of 532 nm, the second harmonic of the aforementioned 1,064 nm light. The wavelength selective mirror which is created by the coating on input surface 24 need not be located on the input surface 24 of lasant material 22. If desired, this mirror can be located anywhere between laser diode 18 and the lasant material 22, and can consist of a coating deposited on any suitable substrate. In addition, the mirror can be of any suitable shape.

Light emitted by the lasing of lasant material 22 from optical pumping means 18, is passed through nonlinear optical material 28. The nonlinear optical material 28 can consist of one or more pieces of the appropriate material. By proper orientation of the crystal structure of the nonlinear optical material 28 with respect to the incident light produced by lasant material 22, the frequency of the incident light can be modified, for example, doubled or tripled, by passage through nonlinear optical material 28. For example, light having a wavelength of 1,064 nm, from a neodymium-doped YAG lasant material 22 can be converted to light having a wavelength of 532 nm upon passage through nonlinear optical material 28. The geometric shape of nonlinear optical material 24 can vary widely. Further, any such nonlinear optical component can comprise heating or cooling means to control the temperature of the nonlinear optical material 28 and thereby optimize its performance as a harmonic generator.

Potassium titanyl phosphate is a preferred nonlinear optical material 28. However, any of the many known nonlinear optical materials can be utilized, such as, $KH_2PO_4$, $LiNbO_3$, $KNbO_3$, $LiIO_3$, $HIO_3$, $KB_5O_8 \cdot 4H_2O$, urea and compounds of the formula $MTiO(XO_4)$ where M is selected from the group consisting of K, Rb and Tl, and X is selected from the group consisting of P and As.

As a consequence of the fact that nonlinear optical material 28 is not 100 percent efficient as a second harmonic generator, light passing through this component from lasant material 22 will ordinarily consist of a mixture of frequency modified and unmodified light. In the case of frequency doubling of light having a wavelength of 1,064 nm from neodymium-doped YAG as the lasant material 22, the light passed through nonlinear optical material 28 will be a mixture of 1,064 nm and 532 nm wavelengths. This mixture of wavelengths is directed to output coupler 30 which has a reflective coating on surface 32, which is wavelength selective. This coating is conventional in character and is selective in such a manner that it is substantially transparent to the 532 nm light but highly reflective with respect to the 1,064 nm light. Accordingly, essentially only frequency doubled light having a wavelength of 532 nm is emitted through the output coupler 30.

The output coupler 30 includes a wavelength selective mirror which is created by the coating on surface 32. It need not be of the precise design illustrated in FIG. 1, and can be of any conventional form. For example, the wavelength selective mirror can be created by a coating on surface 29 of nonlinear optical material 28. In this event, output coupler 30 could be either eliminated or replaced by optical means whose sole purpose is to collimate or otherwise modify the output radiation or laser light from the lasant material 22. The output coupler 30 can be of any appropriate geometric shape. However, the concave shape of the mirror created by the coating on surface 32 has the advantage of focusing reflected light, which has not been frequency doubled, back onto nonlinear optical material 28, through lasant material 22 and onto the coating on input surface 24. As set forth above, in a preferred embodiment, this coating on surface 24 is highly reflective of both frequency doubled and unmodified light from the lasing of lasant material 22. Thus, frequency-unmodified light reflected by the coating on surface 32 is partially frequency doubled by passage through nonlinear optical material 28, the resulting mixture of wavelengths is reflected from the coating on input surface 24 back through nonlinear optical material 28 where some of the residual frequency-unmodified light is frequency doubled, and the frequency doubled light is emitted through output coupler 30. Except for losses, which may occur as a result of processes such as interference, reflection, scattering, absorption or imperfect coatings, further repetition of this series of events results in essentially all of the light produced by the lasing of lasant material 22 being frequency doubled and emitted through output coupler 30.

Referring to FIG. 2, there is schematically drawn an optically pumped laser which is suitable for the practice of this invention. A portable laser head or elongated or tubular housing 40 encloses and houses all of the elements of the instant invention therein. The housing 40 includes a rear and front section, 42 and 44, respectively. The front section 44 has a bore 45 for allowing laser light to be emitted therethrough. The rear section 42, can have a twelve-conductor Hirose connector 46 for connecting power to the laser diode, thermistor, TE cooler, fan, etc., as discussed hereafter. The rear section 42 has three elongated vents 48 around the periphery thereof, near edge 50.

A fan or blower 52 is enclosed, housed and snugly fitted within the rear section 42, and can be adhesively attached to an inner portion of rear section 42. A screen 54 and attaching means or screw 56 are attached to fan 52 within rear section 42, and allows air to be drawn through the vents 48 upstream toward the fan 52. The air to be circulated generally enters through vents 48 at ambient temperature and escapes through the fan 52. The fan 52 when energized draws air about the pins 66 of heat sink 58 for substantially evenly cooling pins 66 and dissipating heat therefrom.

Moving downstream from rear section 42, is a metallic heat sink 58. Preferably, heat sink 58 will be constructed from a metal which has a thermal conductivity in excess of about 2 watt/cm. °C. The heat sink 58 can have a thermal conductivity of less than about 5° C./watt, preferably less than about 1° C./watt, and most preferably about 0.4° C./watt. The metallic heat sink 58 includes a base member 60, with a circular flat side 62 and flange 64, and opposite the flat side 62, is attached a plurality of thermally conductive elongated members or pins 66.

The pins 66 are perpendicular to flat side 62. As will be appreciated by those skilled in the art, the geometric shape of the heat sink 58, as well as the base 60, flat side 62, flange 64 and pins 66 can vary. The above geometric shapes are merely exemplary.

The pins 66 provide a large surface area in a relatively small area within the rear section 42, which improves the air cooling of the pins 66 and the channeling and dissipating of heat away therefrom. The flat side 62 of base 60 has a plurality of fastening bores 68 and a conduit bore 70. The conduit bore 70 allows passage of leads or wires near or downstream of the base 60 to be passed through the metallic heat sink 58 upstream to the connector 46.

The outer diameter of rear section 42 and flange 64 are the same, so that when the housing 40 is fully assembled, it appears as a unitary device. Once assembled, the edge 50 of the rear section 42 touches, abuts, and can be adhesively bonded to a lower portion 65 of flange 64. Thus, when fan 52 is operating, the air is drawn by fan 52 only through vents 48.

Referring to FIG. 4, the plurality of thermally conductive elongated members or pins 66, include nine rings of pins, designated as a, b, c, d, e, f, g, h, and i, respectively, each subsequent ring having a smaller diameter than the preceding ring. The pins 66 can be of any geometric shape. Preferably, the pins 66 are substantially rod shaped and of uniform length and diameter. The ratio of the surface area of the length of each pin 66, which includes the external boundary or circumference from the base 60 to and excluding the tip of each pin, to the circular cross-sectional area of each pin is at least 2:1. The preferred ratio of surface area of the length to circular cross-sectional area of each pin is at least 10:1, and most preferred at least 25:1.

Ring a includes 36 pins each separated by an angle of 10°. Offset from ring a is b, which includes 35 pins each separated by an angle of 10°. One pin is omitted for conduit bore 70. Rings c and d each include 30 pins, and each pin in each ring is separated by an angle of 12°. Ring c is offset from ring d. Ring e includes 20 pins, and each pin is separated by an angle of 18°. Ring f includes 15 pins, and each pin is separated by an angle of 24°. Ring g includes 12 pins, and each pin is separated by an angle of 30°. Ring h includes 4 pins, and each pin is separated by an angle of 90°. And ring i includes one pin in the center of base 60. It should be understood, however, that the geometric shape of each pin, the ratio of the surface area of the length to circular cross-sectional area of each pin, the number of pins in each ring and the angle of separation of each pin in each ring can very widely, and the specific structure illustrated in FIG. 4 represents a preferred embodiment of this invention.

Referring to FIG. 2, in a preferred embodiment the fan 52 is energized to circulate and draw air upstream from the vents 48 to and through the plurality of thermally conductive pins 66 in a substantially homogenous and uninterrupted flow, and to and through fan 52. This provides cold air to be drawn in proximity to the portion of the pins 66 near the flange 64 first, which is the hottest portion, and then upstream along pins 66 to and through fan 52. The fan 52 can also be used to blow air downstream to and through the pins 66 and out vents 48 to maximize the air flow and temperature difference along the pins 66. The rings a, b, c, d, e, f, g, h, and i are positioned so as to force the air to flow uniformly about, and to cool each pin independently, thereby lowering the temperature of heat sink 58, which of course helps to keep the laser diode 88 which is in thermal contact therewith, at a stable temperature. The fan 52 is normally on during operation. The vents 48 allow air to circulate about and air cool pins 66, even if the fan 52 is not energized.

Referring to FIG. 3, downstream of metallic heat sink 58 is a thermo-electric (TE) heater/cooler 72, a spreader 80, a laser diode 88 and a resonator housing 120. As illustrated in FIG. 3, the TE cooler 72 has a lower section, a hot junction or plate 74, which is thermally conductive and electrically insulative, a cold junction or platform 76 thereabove, and legs 78 attaching platform 76 to plate 74.

The TE cooler 72 is utilized to remove waste heat from the laser diode 87 or a solid state device and be monitored using conventional temperature sensors, such as thermocouples, thermistors, etc. When the temperature deviates from a desired value, a voltage is produced in the sensing circuit. The sign of this voltage indicates whether the temperature is warmer or colder than the preset null point. Current is automatically supplied in the direction necessary to correct the temperature drift. The TE cooler 72 is in thermal contact with heat sink 58 to dissipate and absorb heat in order to maintain the required temperature.

Generally, in a thermoelectric cooler, semiconductor materials with dissimilar characteristics are connected electrically in series and thermally in parallel, so that two junctions are created.

The legs 78 are made of alternating N and P-type semiconductor materials, and are so named because either they have more electrons than necessary to complete a perfect molecular lattice structure (N-type) or not enough electrons to complete a lattice structure (P-type). The extra electrons in the N-type material and the holes left in the P-type material are called "carriers" and they are the agents that move the heat energy from the platform 76 or cold junction to the plate 74 or hot junction.

Referring to FIG. 3, the plate 74 can be made of a ceramic material, such as beryllium oxide, alumina ($Al_2O_3$), or boron nitride, preferably beryllium oxide due to its superior thermal conductivity. The plate 74 has a larger surface area than the platform 76, and such plate 74 dissipates heat toward heat sink 58, not only in the area directly below platform 76, but also in the area (not directly below platform 76) away from platform 76.

A spreader 80 is in direct thermal contact with, and attached to and above platform 76. The spreader 80 is both thermally and electrically conductive, and for example can be made of copper with a gold plating. The spreader 80 has top, bottom and inclined surface 82, 84, and 85, respectively. The top surface 82 can have a bore for fastening a laser diode thereto.

A submount-packaged laser diode 87, such as, but not limited to, Sony Model SLD 304B or a Spectra Diode Laboratories Model SDL 2460-C is attached above and fastened to the top surface 82 of spreader 80, as illustrated in FIG. 3. The submount package 87 includes a mounting block or heat sink 86 and a laser diode 88, with a fastening means or screw 90 attaching the mounting block 86 to the top surface 82 of the spreader 80. As is known to those skilled in the art, the type of laser diode package and the geometric shape of all of the devices described herein can vary. Accordingly, the particular package 87 described herein is merely exemplary.

As illustrated in FIG. 3, power is applied to laser diode 88 by ground lead 94 and positive lead 92, which is attached to first and second inner posts 93 and 95, respectively.

A temperature sensing means, such as a thermistor or thermocouple 96 can be attached to platform 76, as illustrated in FIG. 3, to sense the temperature. The thermistor 96 has a first lead 98 and second lead 100 each of which is electrically connected to a third and fourth inner post 99 and 101, respectively. A fifth and sixth inner post 102 and 103 are included for use with an optical photo diode to monitor the power output of laser diode 88, which is not illustrated in FIG. 3. The inner posts 93, 95, 99, 101, 102, and 103 are electrically connected to first, second, third, fourth, fifth, and sixth outer posts 104, 105, 106, 107, 108, and 109, respectively by electrically conductive leads on the top surface of plate 74, (see FIGS. 2 and 3). It should be understood, however, that such leads could be within or on the bottom of plate 74, and that the placement of such leads on the top surface of plate 74 merely represents a preferred position. Thus, plate 74 is also utilized as a circuit board. Seventh and eighth outer post 110 and 111, are electrically attached by conductive leads on the top surface of plate 74 to the TE cooler 72 and are utilized for applying power to the TE cooler 72.

Although not illustrated in the figures, the first, second, third, fourth, fifth, sixth, seventh, and eighth outer posts 104, 105, 106, 107, 108, 109, 110, and 111, are electrically connected by wires or leads through at least one conduit bore 70 of metallic heat sink 58 to the connector 46. The fan 52 leads would also be connected to connector 46.

Enveloping the laser diode 88 is a cover 112, which can be metallic, although any other suitable material, such as plastic, can be used. The cover 112 includes a transparent window 114 through which output radiation from laser diode 88 is transmitted. An inert gas, such as argon or nitrogen, can be enclosed in cover 112. If cover 112 is metallic, an insulating layer on ring 116 can be deposited on plate 74 so as not to short the electrical connections between the inner and outer posts. Plate 74 has a plurality of bores for connecting or fastening the plate 74 to the heat sink 58.

Downstream of the laser diode 88 and heat sink 58 inserted snugly within front section 44, is a resonator housing 120. The resonator housing 120 includes a center bore 122 and fastening bores 124. The fastening bores 124 provide a means for fastening or screwing the resonator housing 120 through plate 74 to heat sink 58. Referring to FIG. 1, the elements within the dashed line designated as 120 can be held securely within the resonator housing 120 center bore 122.

During operation, waste heat is produced by the laser diode 88 when such laser 88 is operated to produce optical pumping radiation for lasant material 22. This waste heat is efficiently conveyed away from the laser diode 88.

Since heat flow can be impeded at the junction between materials, the lower the number of junctions connecting a laser diode to a heat sink, the more efficient the heat can be channelled and dissipated away from such laser diode. As illustrated in FIGS. 2 and 3, the heat dissipating device 10 includes only four junctions 128, 130, 132 and 134, which only slightly interfere with this channelling. The laser/mounting block junction 128 is where the laser diode 88 interfaces with the mounting block 86 of package 87. The mounting block/spreader junction 130 is the area where the mounting block 86 contacts the top surface 82 of the spreader 80. The third junction is the spreader/TE cooler junction 132 where the bottom surface 84 of spreader 80 and the top surface of the platform 76 of TE cooler 72 meet or interface. The fourth junction is the TE cooler/heat sink junction 134, where the bottom surface of plate 74 and the flat side 62 of the metallic heat sink 58 meet or interface.

The geometric shape and surface area of each of the aforementioned junctions thermally contact and closely match that of the adjoining elements. Accordingly, the geometry of the laser/mounting block junction 128 closely matches and is substantially the same as the geometric shape of the laser diode 88 and mounting block 86 at that junction 128. Similarly, the rectangular shape and surface area of the mounting block/spreader junction 130, closely matches the geometric shape and surface area of the mounting block 86 and top surface 82 of spreader 80. In a similar fashion, the rectangular spreader/TE cooler junction 132, closely matches the geometric shape and surface area of the bottom surface 84 of spreader 80, and the platform 76 of TE cooler 72, and the annular shape and surface area of the TE cooler/heat sink junction 134, closely matches the geometric shape and surface area of the plate 74 and the flat side 62 of the heat sink 58. It should be understood, however, that any geometric shape for each junction can be utilized as long as the surface area and geometry of the adjoining elements and junction are closely matched to allow maximum heat dissipation.

Waste heat is channeled and spread out from laser diode 88, upstream through junctions 128, 130, 132 and 134 to heat sink 58. The surface area of each subsequent junction is larger than the one preceding, for an enhanced and even heat spread from junctions 128, 130, 132 and 134 to the heat sink 58.

The efficiency of waste heat removal is further attributable to the large surface area of the plurality of thermally conductive elongated members or pins 66. The high number of pins 66 maximizes and utilizes a relatively small volume in housing 40 for air cooling the heat sink 58. Such a condensed and small volume allows the housing 40 (or laser head) to be portable, light weight and durable.

The pin design comprising rings a-i, allows air to evenly circulate in an efficient manner, whether the fan 52 is energized or not. When the fan 52 is energized, air is substantially circulated homogenously and evenly about the pins 66. The rings a-i are designed to channel and deflect the air in such a pattern through pins 66 that maximizes the deflecting of air through the pins 66. More particularly, the pins 66 are configured to allow the air to be drawn in through the vents 48, through the pins 66 in an inwardly direction from ring a to ring i, then upstream and through fan 52. The design of pins 66 provides a substantially complete, full and virtually uniform air distribution and circulation for efficient and effective thermal dissipation.

The front section 44 of the housing 40 has the same outer diameter as the flange 64, so that when the housing 40 is fully assembled, it appears as a unitary and portable laser head, which is energized by a power supply through a cable connected to connector 46.

In an alternative embodiment not shown in the drawings, the laser diode 18 of the instant invention can be replaced with any solid state or semiconductor device, such as, but not limited to an infra red detector or charge coupled device. It will be appreciated that the term semiconductor is generally synonymous with the term solid state, and as used herein refers to a material in which an electric current is carried by electrons or holes and is characterized by a bandgap which is the difference in energy between an electron in the material's normally filled valence band and an electron in the conduction band of the material. Such materials have a relatively low electrical conductivity which can be increased by several orders of magnitude by doping with electrically active impurities. Conventional semiconductors include silicon, germanium and various combinations of elements from Groups III and V of the Periodic Table such as InAs, InP, GaP, GaAs, AlAs, AlGaAs, InGaAs, InGaAsP, InGaP and InGaAlP. A tabulation of some of the more common semiconductors and their general properties is set forth at pages E-102 through E-105 of the *Handbook of Chemistry and Physics*, 68th Ed., CRC Press, Inc., Boca Raton, Fla. (1987–1988). In such an embodiment, an apparatus for dissipating waste heat is disclosed, which comprises: (a) a solid state device; and (b) a heat sink 12 including a base member 14 being in thermal contact with the solid state device and a plurality of elongated heat-conducting elements 66 extending outwardly from the base member 14.

Although only one embodiment of this invention has been shown and described, it is to be understood that various modifications and substitutions, as well as rearrangements and combinations of the proceeding embodiment, can be made by those skilled in the art without departing from the novel spirit and scope of this invention.

We claim:

1. An apparatus comprising:

(a) a solid state device for generating optical radiation; and (b) a heat sink including a base member being in thermal contact with said solid state device and a plurality of substantially rod-shaped heat-conducting elements extending outwardly from said base member.

2. The apparatus in accordance with claim 1, wherein the ratio of the surface area along the length of each of said elements to its circular cross-sectional area is at least 2:1.

3. The apparatus in accordance with claim 2, wherein said heat sink includes thermoelectric heater/cooler means for moving waste heat away from said solid state device, and wherein said thermoelectric heater/cooler means includes a plate which is sandwiched between said solid state device and said base member of said heat sink.

4. The apparatus in accordance with claim 3, wherein said plate is made of a thermally conductive and electrically insulative material.

5. A laser diode apparatus comprising:

(a) a laser diode for generating laser light;

(b) a heat sink including a base member being in thermal contact with said laser diode and a plurality of elongated heat-conditioning elements extending outwardly from said base member; and (c) housing means for securely housing said laser diode and said heat sink, said housing including a rear section having vents in proximity to said heat sink for allowing air to move freely about said elongated heating conducting elements of said heat sink, and further including a front section having an opening therein for allowing laser light to be transmitted therethrough.

6. The apparatus in accordance with claim 5, further comprising circulating means for circulating air about said plurality of elongated heat-conducting elements of said heat sink.

7. The apparatus in accordance with claim 6, wherein said housing substantially houses said circulating means for allowing said circulating means to circulate air substantially evenly to and about said plurality of elongated heat-conducting elements of said heat sink.

8. The apparatus in accordance with claim 5, wherein said heat sink includes a plate, said plate being sandwiched between said laser diode and said base member of said heat sink for providing a secure thermal interface between said laser diode and said heat sink.

9. The apparatus in accordance with claim 8, wherein said plate is made up of a thermally conductive and electrically insulative material.

10. An optically pumped laser, comprising:

(a) solid-state component means for generating laser light, said solid-state component means including solid state optical pumping means for generating optical pumping radiation, and a lasant member comprising a solid lasant material for receiving said radiation from said optical pumping means and emitting laser light; and (b) heat removal means for removing heat from said optical pumping means wherein said heat removal means comprises a base member in thermal contact with said optical pumping means, and a plurality of substantially rod-shaped heat-conducting elements extending outwardly from said base.

11. The optically pumped laser in accordance with claim 10, wherein said heat removal means has a thermal conductivity of less than about 5° C./watt.

12. The optically pumped laser in accordance with claim 10, wherein said heat removal means additionally comprises circulating means for circulating air about said plurality of elongated heat conducting elements.

13. The optically pumped laser in accordance with claim 10, wherein said solid-state optical pumping means comprises at least one member selected from the group consisting of laser diodes, laser diode arrays, light-emitting diodes and light-emitting diode arrays.

14. The optically pumped laser in accordance with claim 10, wherein said solid-state optical pumping means comprises a laser diode.

15. The optically pumped laser in accordance with claim 10, further comprising focusing means for focusing light from said solid-state optical pumping means to said lasant material and a nonlinear optical member for modifying the frequency of said laser light from said lasant material.

16. A method of dissipating waste heat produced by a laser diode, comprising:

(a) generating laser light from a laser diode while simultaneously producing waste heat;

(b) conveying said waste heat generated by said laser diode away therefrom with a heat sink which comprises a base member in thermal contact with said laser diode, and a plurality of substantially rod-shaped heat-conducting elements extending outwardly from said base; and (c) circulating air about said plurality of substantially rod-shaped heat-conducting elements of said heat sink whereby heat is transferred from said heat-conducting elements to said circulating air.

17. The method of dissipating waste heat produced by a laser diode in accordance with claim 16, wherein said circulating air is supplied to the substantially rod-shaped heat-conducting elements at about ambient temperature.

* * * * *